United States Patent [19]

Flachenecker et al.

[11] Patent Number: 4,890,073

[45] Date of Patent: Dec. 26, 1989

[54] HIGH FREQUENCY GENERATOR FOR USE WITH LOADS SUBJECT TO GREAT IMPEDANCE VARIATIONS

[75] Inventors: Gerhard Flachenecker, Ottobrunn; Karl Fastenmeier, Munich; Heinz Lindenmeier, Planegg, all of Fed. Rep. of Germany

[73] Assignee: Erbe Elektromedizin GmbH, Tubingen, Fed. Rep. of Germany

[21] Appl. No.: 314,413

[22] Filed: Feb. 22, 1989

[30] Foreign Application Priority Data

Feb. 25, 1988 [DE] Fed. Rep. of Germany ....... 3805921

[51] Int. Cl.$^4$ .......................... H03B 5/08; H03B 1/02
[52] U.S. Cl. ...................... 331/55; 331/167; 331/173; 331/175; 331/183
[58] Field of Search ................... 331/47, 55, 167, 168, 331/172, 173, 175, 183, 117 R, 117 FE

[56] References Cited

U.S. PATENT DOCUMENTS 3,276,032 9/1966 Ordower ........................ 331/117 X

OTHER PUBLICATIONS

"DC/AC-Converter with High Efficiency", Elektronik 1983, vol. 4, pp. 67-71 (in German language), Feb. 25, 1983.

*Primary Examiner*—Siegfried H. Grimm
*Attorney, Agent, or Firm*—Frishauf, Holtz, Goodman & Woodward

[57] ABSTRACT

A power amplifier driven in the switching mode is started into oscillation by a pulse from an auxiliary oscillator when it is first activated. Reactive currents thereby resulting in an output filter network, containing a series resonant circuit followed by a parallel resonant circuit which is connected across a load impedance, then produce the switching in of a feedback circuit, after which the amplifier oscillates in a self-excited mode, at a frequency determined by the tuning of the resonant circuits. Branch circuits connected to the output filter network determine whether the load impedance is above or below the characteristic impedance value, which is a function of the inductance in the series resonant circuit and the capacitance in the parallel resonant circuit, and control an electronic switch which enables current-driven feedback when the load impedance is below the characteristic value and enables voltage feedback when the load impedance is above the characteristic value, thus providing the more stable type of feedback consistently, even though the load may fluctuate greatly. The electronic switch preferably operates with some hysteresis. This high frequency power oscillator adjusts itself automatically to mistuning of the output filter network as well as to large fluctuations of load impedance. The loss power in the amplifying elements of the power amplifier is very low and the efficiency very high.

23 Claims, 5 Drawing Sheets

HIGH FREQUENCY GENERATOR FOR USE WITH LOADS SUBJECT TO GREAT IMPEDANCE VARIATIONS

The invention concerns a high frequency generator for providing high frequency power input to a variable or unknown load impedance and more particularly of a kind in which a power amplifier operating in a switching mode has an output filter network for connecting the amplifier to a load impedance, the network comprising a series resonant branch and a parallel resonant branch both tuned to about the midfrequency of operation of the generator, the series resonant branch being interposed between the parallel resonant branch and the output of the power amplifier.

High electric power outputs of high frequency are needed for many industrial, medical or scientific applications. Examples of such applications in industry are drying installations which operate by warming a material by dielectric losses in a high frequency field or melting apparatus in which a conductive material to be melted is heated by eddy currents in a high frequency field. In medicine high frequency power outputs are needed for example for high frequency surgery. In science such power outputs are needed for example for excitation of a plasma in spectrum analysis.

Most of these applications have the common problem that the loading of the high frequency power generator is, as a rule, far from constant and is, moreover, frequently subject to large and sudden changes. In high frequency surgery, for example the impedance of a surgical probe connected to the high frequency generator can change within milliseconds between about 50 ohms and 4000 ohms. The reactive component of the load impedance can also fluctuate quickly over a great range. An example of such changes is provided at the instant of melting in a high frequency melting furnace: whereas the material to be melted initially lies loosely aggragated in a crucible, at the instant of melting it unites into a compact mass. The current distribution in the material to be melted, and therefore the spatial distribution of the magnetic field, can fundamentally change in an instant. To the high frequency power generator this phenomenon represents a rapid change of the reactive component of the load impedance.

Another common characteristic of these applications of high frequency generators is the fact that the effect to be produced by means of the high frequency power does not depend upon a strict maintenance of a particular frequency. In high frequency surgery, for example, frequencies between 300 kHz and 2 MHz are usual, without traceable differences among the effects of different frequencies. For high frequency melting furnaces frequencies from 200 kHz and even up to 27 MHz are used. The maintenance of a particular frequency can be prescribed mainly by government regulations for prevention of producing radiation disturbing other services, in the event the field generated by the high frequency generator is not shielded off from the environment. In the case of sufficiently shielded applications and, particularly, most high frequency surgery apparatus, this limitation hardly ever comes into play.

Beyond the above considerations, all of the applications mentioned above have a requirement of high efficiency. For example high frequency surgical apparatus for operation in an operating room is not permitted to have a ventilator fan or blower for cooling, because bacteria could be stirred up by the cooling air stream. For an available high frequency power of, for example, 400W an efficiency of at least 90% is then necessary for the high frequency power generator in order that the apparatus should not heat up intolerably.

In order to provide adequate high frequency power it is usual today for an amplifier element of the high frequency power generator to operate in a switching mode, especially by means of transistors. Thus practically all contemporarily available high frequency surgery devices, for example, operate according to this principle.

In the switching mode harmonics (overtones) appear in the spectrum of the output voltage that are a source of many disadvantages. In high frequency surgery the high frequency harmonics generate high capacitive leakage currents in comparison to the actual operating frequency. These leakage currents risk burning the skin of patients. Furthermore the unavoidable stray elements of the circuit may produce strong harmonic oscillations which impair the operating safety of the amplifier elements by producing excessive voltages.

It is also known that with switching amplifiers it is not always possible to obtain a desired efficiency, because of the switching-off delays of the amplifying elements.

A high frequency generator is described in the article "DC/AC Converter of High Efficiency" published in Elektronik, Issue 4 of 1983, p. 67, which attempted with various measures to overcome the disadvantages of simple switching amplifiers. For these purposes a power amplifier was used having transistors connected in a so-called quasi-complementary stage and operated in the switching mode. At the output of this power amplifier there is connected in series a series resonant circuit which leads the output current of the amplifier to a parallel resonant circuit connected to ground, thus connected in parallel with respect to the amplifier. The inductance of this parallel circuit serves for coupling to a load, in the described example, the eddy currents generated in a material to be heated. The transistors of the power amplifier are driven by a fixed frequency oscillator that is tuned to the operating frequency. Both the series resonant circuit and also the parallel resonant circuit are likewise tuned to this operating frequency. The series resonant circuit makes it possible for the output current of the power amplifier to be almost purely sinusoidal. Thus the current goes through 0 after every half period of the high frequency oscillation, i.e. exactly when the conductive state is being switched over from one to the other of the transistors. By this means the switching-off losses in the transistors are particularly small, because the current in the transistors is already down to 0 at the moment of switching off. Switching off delays therefore practically do not appear in the transistor. A much higher efficiency is obtained in this way than with simple broadband switching amplifiers.

By means of the parallel resonant circuit the load impedance at the operating frequency in the above-described apparatus is brought to a real value in order to avoid phase shifts between current and voltage as well as reactance currents. Logic circuitry in the base circuits of the transistors assures that the switching on of each transistor does not take place until the collector-emitter voltage has fallen approximately to the value of the saturation voltage, i.e. when the reversal of the output voltage because of the switching off of the other transistors is blocked. If the switching on point of one transistor is delayed with respect to the switching off point of the other transistor by this logic, the current of the series resonant circuit must nevertheless continue to flow. For this reason recovery diodes are connected in parallel to the transistors.

In practice this high frequency power generator has decisive disadvantage, however. When there are load fluctuations, especially with change of the imaginary (reactive) component of the load impedance, the resonance frequency of the parallel resonant circuit is detuned with respect to the operating frequency. The voltage across the parallel resonance circuit and the current through the series resonant circuit are then no longer in phase. This leads to the situation that the null transition of the output current of the power amplifier no longer coincides with the switchover instant of the transistor control. In consequence switching-in delays occur for the transistors during which the output current necessarily flows through the recovery diodes. When the switching in then occurs, the current to be taken over by the transistor is no longer approximately 0 as in the ideal case, but can already have very high values. This leads to rapidly increasing switch-in losses and to a drastic decline of the efficiency. As a result of the phase shift the available output power of a high frequency power generator is also basically reduced.

The same effect appears when the resonant frequencies of the series resonant circuit and of the parallel resonant circuit are not exactly tuned to each other or if by aging of the components the inductances and capacitances of the resonant circuits change resulting in the resonant frequencies of these circuits also changing. The same also holds for an inexactly adjusted or trimmed operating frequency of the controlling oscillator and for the change of that frequency by aging. In each case the losses in the transistors and recovery diodes increase and the available power and the efficiency decline. With greater mistuning the increasing loss power can lead to distruction of the amplifier elements.

SUMMARY OF THE INVENTION

An object of the present invention is to provide a high frequency power generator of which the efficiency and output power remain steadily high while the load impedance undergoes strong changes and likewise when different resonant frequencies develop in the resonant circuits, and wherein, moreover, impairment of high frequency power generator by mistuning, aging of the components and strong load fluctuations are prevented and safe and reliable operation is made possible.

Briefly, in a high frequency oscillator utilizing a power amplifier operating in a switching mode preferably constituted as a complementary quasi-complementary stage and having an output filter network comprising, in an input series branch, a series resonant circuit approximately tuned to the midfrequency of operation of the generator and, in a parallel branch, a parallel resonant circuit likewise approximately tuned to the midfrequency of operation of the generator. An auxiliary oscillator may be provided in addition which is connected for supplying an oscillation start voltage to the power amplifier at a particular phase of oscillations of the auxiliary oscillator. Means are provided to supply self-excitation of oscillation of the power amplifier superseding further excitation by the auxiliary oscillator—if provided—following an oscillation start produced by the auxiliary oscillator. These self excitation means are constituted by feedback connections between the output filter network and the power amplifier, responsive to values of current in the filter network differing substantially from 0 and also responsive to values of voltage in the network differing substantially from 0. These feedback connections make available a current-driven feedback whenever the value of the load impedance falls below a predetermined characteristic impedance value, and also a voltage driven feedback for feedback whenever the value of the load impedance rises above the said predetermined characteristic impedance, with these feedback circuits including a pulse shaping stage, which may be the same stage used in common by both circuits. The excitation means also includes electronic switching means including a switching element for selectively switching one or the other of the feedback circuits into activity and for assuring the timely transfer of feedback action between them during load impedance fluctuation when the generator is in use.

If an auxiliary oscillator is provided, it is connected to the input of the power amplifier and provides an oscillation initiating function at the instant of switching on of the high frequency generator. A dependable start-up of operation of the high frequency generator is therefore externally excited or controlled. As soon as the high frequency generator is swung into operation, i.e. when in the output circuit of the power amplifier a current flows which is distinctly different from zero or a voltage is established which is distinctly different from zero, the excitation of the power amplifier is switched over to self-excitation, i.e. excitation by feedback from the output circuit of the power amplifier.

The feedback voltage is taken in two different ways from the output circuit of the power amplifier: it is either obtained through an electrical converter from current flowing through the series resonant circuit, with pulse shaping, as a result of which current-driven feedback takes place or else it is obtained through an electrical converter from a voltage present across the parallel resonant circuit followed by pulse shaping, as a result of which a voltage feedback takes place. An electronic element is provided for switching between current feedback and voltage feedback in the control circuits of the electronic switch element such that the switch element switches in the current feedback when the value of the load impedance connected to the high frequency generator is less than the present or predetermined characteristic impedance value and switches in the voltage feedback when the value of load impedance is greater than the preset or predetermined characteristic impedance value. This electronic switch element can accordingly carry out switching back and forth between current and voltage feedback in further operation of the generator if and when the load impedance fluctuates and the value of the load impedance rises above or falls below the preset or predetermined characteristic impedance value.

The high frequency power generator of the invention operates with external excitation by an auxiliary oscillator only in the instant of going into oscillation. The actual continuing operation takes place in a self-excitation mode, however. In this way variations in frequency tuning of the series resonant circuit and of the parallel resonant circuit are automatically compensated for by the necessary fulfillment of the feedback condition. Also, changes in the real component and especially in the imaginary component of the load impedance are automatically taken into account by the feedback. The frequency always sets itself in such a way that the necessary feedback conditions for oscillation are fulfilled. This is in general the effective resultant midfrequency of the output filter network inclusive of the load impedance. Frequency errors of external excitation can a priori have no effect.

The type of feedback is not fixably selected in a high frequency power generator according to the invention. Instead, according to the magnitude of the load impedance connected to the generator, either current feedback or voltage feedback is selected. In the case of low-ohm-value load impedances current feedback is used. The parallel resonant circuit is very strongly damped by such low-ohm value load impedances and the series resonant circuit is then the actual frequency-determining branch of the output filter network. A high value of current flows through the series resonant circuit and the reactive power therein is high. In contrast thereto the voltage in the parallel resonant circuit is low and the reactive power conversion therein is small. In this case current feedback provides stable operation with the least possible phase-shift between current and voltage at the output of the power amplifier.

In the case of high-ohm values load impedance, on the other hand, voltage feedback is selected. Because of the high-ohm value load impedance, the parallel resonant circuit is only weakly damped and now constitutes the actual frequency-determining branch of the output filter network. Only a small current now flows through the series resonant circuit and the reactive power therein is small. In contrast thereto, the voltage across the parallel resonant circuit is high and the reactive power converted there is great. In this case voltage feedback provides the most stable operation.

Slight phase shifts between the current and voltage at the output of the power amplifier are insignificant, because the current is altogether small because of the high-ohm value load. The switching to voltage feedback for high impedance loads has still a further advantage based on the multiple values of resonance of the input impedance of the output filter network for high load impedance. This is further described in greater detail below.

The advantage of the feedback in combination with the switching over between current and voltage feedback, in contrast with the prior state of the art, lies in the fact that the high frequency power generator operates consistently at the actual midfrequency of the output filter inclusive of the load impedance, even under strongly fluctuating load impedances. This fact results in a particularly stable operation with low values of loss power in the amplifier elements of the power amplifier, with maintanence of a high efficiency and maintenance of a high level of available power. This stable operation extends also all the way to the conditions of a short circuited load and a load that absorbs no power (open circuit load), resulting in idling operation.

In accordance with the invention, the characteristic value of the connected load impedance is used as the criterion for switching between current feedback and voltage feedback. A characteristic value $R_c$ for the load impedance at which the switchover takes place can advantageously be determined for every high frequency power generator constructed according to the invention. Such a determination can be performed, for example, experimentally. The ranges of the load impedance in which current feedback and voltage feedback provide the most stable operation can be determined separately. The characteristic impedance can be taken to be a value lying between the stability boundaries thus respectively determined.

The inventors have found that current feedback can be selected when the reactive power in the series resonance circuit is substantially greater than the reactive power of the parallel resonant circuit. Conversely, voltage feedback should be selected when the reactive power in the parallel resonant circuit is substantially greater than that in the series resonant circuit. The distribution of the reactive power between the two resonant circuits depends, however, on the actual value of the load impedance. A particularly practical switchover boundary is accordingly the load impedance at which the reactive powers in the two resonant circuits are equal.

In an advantageous development of the invention the characteristic value of the load impedance at which switching is done between current and voltage feedback is so chosen that it corresponds approximately to the equation $$R_c = \sqrt{L_s/C_p}$$

where $L_s$ is the inductance of the series resonant circuit and $C_p$ is the capacitance of the parallel resonant circuit. At this characteristic impedance the reactive powers in both resonant circuits are exactly equal.

In many applications the average impedance level of the load clearly mismatches the recommend load given in the operating condition data for the amplifier elements (transistors) in the power amplifier of the high frequency generator. In these cases the coil of the parallel resonance circuit can, in a well known way, be built as a transformer. With such a transformer a load which on the average has a very high impedance can be matched to the outputs of the amplifier elements having high permissible currents but little tolerance for overvoltage. In a further development of the invention the inductance of the parallel resonance circuit is therefor constituted as a transformer while the capacitance of the parallel resonant circuit is connected to the primary winding of the transformer, i.e. the winding which is connected directly or indirectly to the power amplifier. In order that the feedback here takes place, in accordance with the invention, over the network branch storing the greatest reactive energy, the switch-over between voltage and current feedback must take place at a characteristic value of the load impedance of above $$R_c = n^2 * \sqrt{L_s/C_p}$$

where n is the voltage transformation ratio of the transformer.

In many cases it can additionally be desired for the capacitance of the parallel resonant circuit to be connected in parallel to the secondary winding of the transformer. This can be the case, for example, if the output impedance of the high frequency power generator should approach 0 asymptotically at high frequencies, a result that cannot be obtained in the previously discussed arrangement because of the unavoidable stray inductance of the transformer. In a further development of the invention, therefore, the inductance of the parallel resonance circuit is constituted as a transformer and the capacitance of the parallel resonant circuit is connected to the secondary side of this transformer. In this case the switching of the feedback between voltage and current feedback takes place when the load impedance rises above or falls below a characteristic value given approximately by the equation $$R_c = n * \sqrt{L_s/C_p} .$$

where n is the transformation ratio of the transformer.

For putting into effect the correct kind of feedback the instantaneously effective load impedance must be at least approximately known. It must be compared with the characteristic value at which the switch-over is to take place. In a development of the invention for this purpose the measuring arrangement for determining a magnitude proportional to the output voltage of the high frequency power generator (which may be the voltage value itself) and a measurement arrangement for determining a magnitude proportional to the output current of the high frequency power generator are provided. The proportional measurement factors of the respective measuring arrangements are so preset that their output signals are approximately equal at the time when the impedance connected to the high frequency power generator has the characteristic value. A comparator circuit is provided which compares the output signals of the two just mentioned measuring devices with each other. The output signal of this comparator circuit then jumps from one state to another when the load impedance becomes either greater or smaller than the above-mentioned characteristic value and can accordingly be used to control the switching over between voltage and current feedback in the feedback path of the high frequency current generator.

In many cases a high frequency current generator is operated with an approximately constant output voltage. In such cases the determination of the instantaneous load impedance can be dispensed with in favor of measurement of the output voltage. In a further development of the invention, therefor, there is provided, for the determination of the load impedance, only a measurement circuit for determining a magnitude proportional to the output current of the high frequency power generator.

In addition a comparator circuit is provided in which the output of this mesurement circuit is compared with a reference value that is so chosen that it is equal to the output of the measurement circuit in the case in which the load impedance is equal to its characteristic value. The output signal of the comparator circuit jumps from one state to another when the load impedance rises above or falls below the characteristic value and is used for switching over between voltage and current feedback in the feedback path of the high frequency power generator.

The inventors have ascertained, by measurements with many high frequency power generators constructed in accordance with the invention, that precisely holding to the characteristic impedance value for switching between current and voltage feedback is not necessary, and that certain deviations therefrom are permissible. In order to prevent frequent switching back and forth in the case of a load impedance the value of which may fluctuate randomly about the characteristic value, a further development of the invention provides for control of the switch over operation for the feedback by a comparator circuit that has built-in hysteresis.

High frequency power generators according to the invention are very frequently operated intermittently. An example of such operation is to be found in high frequency surgery: a high frequency surgery generator is switched on as an apparatus during the entire operation, but high frequency power is to be delivered in every case only for brief periods for cutting or coagulating tissues. This means that all auxiliary voltages of the apparatus do indeed remain available for a long period, but the actual high frequency power generator, on the other hand, is always switched-on temporarily, only by actuating an activation switch. In the following embodiments, therefor, a distinction should be made between two kinds of "switching-on". First the apparatus as a whole must be put into operation with all auxiliary voltages and such peripheral functions as may be appropriate for readiness. The actual high frequency power generator contained in the apparatus is as a rule switched in only later and not always for long. The further explanations regarding the start-up procedure relate always to the switching-on of the high frequency power generator, for example even after an operational pause during which the entire apparatus remains indeed switched on in the ready state, but no high frequency power is generated or delivered.

At each switching-on of the high frequency generator an oscillation start phase of operation must be initiated. The auxiliary oscillator which serves to assist oscillation start must excite the power amplifier long enough for the feedback circuit to take enough current or voltage at the operating frequency from the output circuit to maintain self-excitation.

In the simplest case the auxiliary oscillator according to the invention is so constituted that it provides a single pulse at the input of the power amplifier at every switching on of the high frequency power generator. Such a single pulse excites the output filter network composed of the series resonant circuit and the parallel resonant circuit to execute reactions which already involve currents and voltages of the operating frequency and are sufficient in most cases for further excitation of oscillations through the feedback circuits. In order to provide excitation more reliably, the auxiliary oscillator, according to a further development of the invention, can provide after every switching-on of the high frequency power generator a succession of individual pulses at the input of the power amplifier that continues until the high frequency power generator has been put into oscillation, i.e. the excitation of the power amplifier has been switched over to feedback. In this case the timewise spacing of the individual pulses should be greater than the duration of the period of the desired average operating frequency, so that in the output circuit no more reaction effects with unfavorable phase relations would add themselves to the desired oscillations.

A particularly reliable starting up is obtained with a further development of the invention in which the auxiliary oscillator provides a continuous alternating current of the frequency which corresponds to the average operating frequency of the high frequency power generator. This auxiliary oscillator can advantageously also be a voltage controlled oscillator (VCO), the quiescent frequency of which corresponds to the average operating frequency of the high frequency power generator. In each start of operation of the high frequency power generator this VCO first oscillates at the midfrequency of the operating frequency range. It is desirable to provide a phase regulating circuit which, whenever the high frequency power generator itself oscillates, i.e. operates with voltage or current feedback, the frequency of the auxiliary oscillator will be synchronized with the instantaneous operating frequency of the high frequency generator. It is further recommended that the auxiliary oscillator should be allowed to continue oscillations, during the various pauses in the use of the high frequency generator, at the frequency at which the auxiliary oscillator was last set. Then with a renewed activation of the high frequency power generator the auxiliary oscillator will supply the last actual operating frequency of the high frequency generator as a start-up aid to the power amplifier. This frequency has the most probable value for the frequency at which the high frequency power generator will oscillate further after the switching to self-excitation.

BRIEF DESCRIPTION OF THE DRAWINGS

The invention is further described by way of illustrative examples by reference to the annexed drawings in which.

Figure 1:
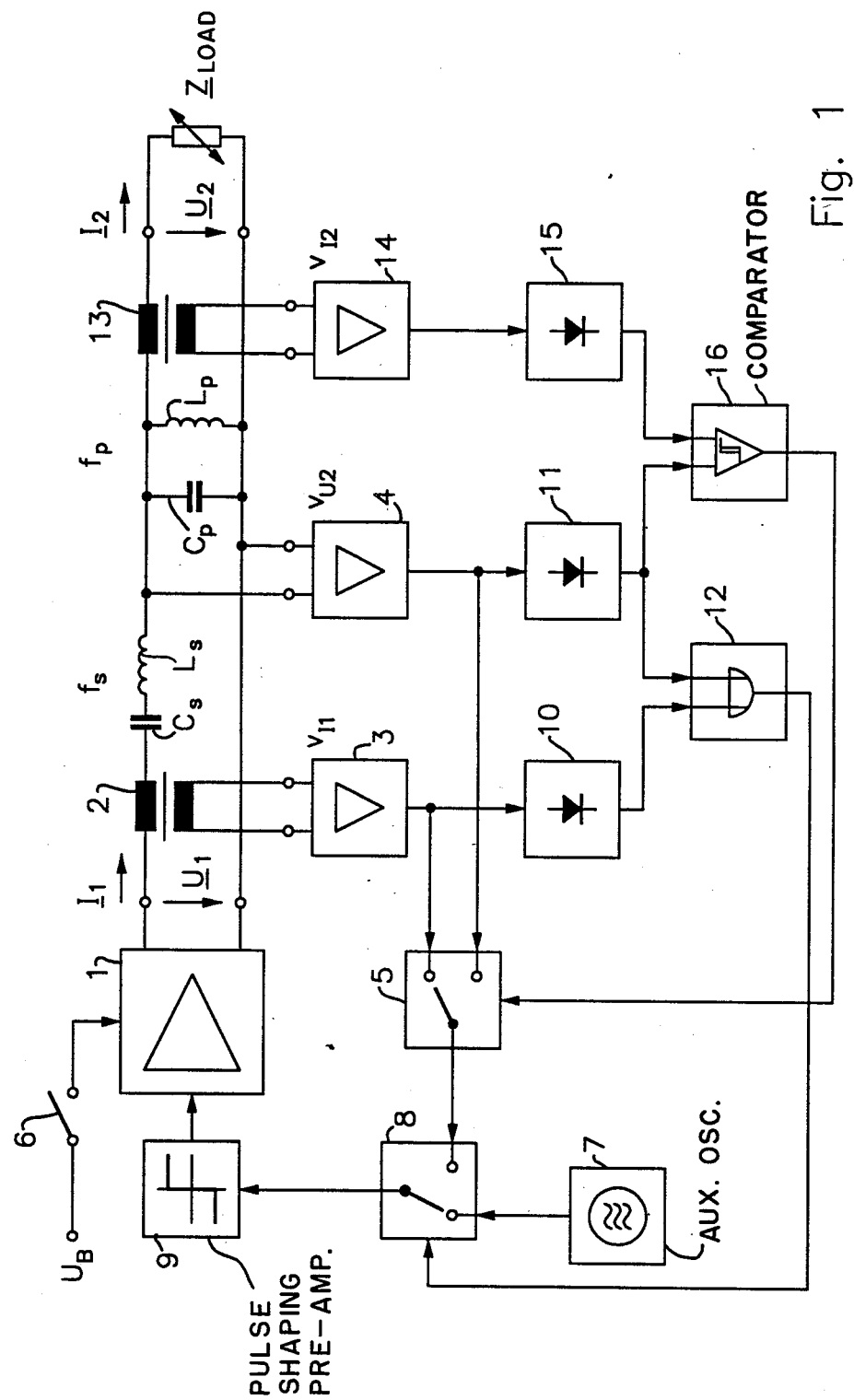
FIG. 1 is a circuit diagram of a high frequency power generator with measurement circuits for current and voltage for determining the load impedance.

DESCRIPTION OF THE ILLUSTRATED EMBODIMENTS:

FIG. 1 is a block circuit diagram of a high frequency power generator with measurement circuits for current and voltage measurement for determining the load impedance. The high frequency power generator includes a power amplifier 1 built as a complementary or quaisi-complementary circuit, at the output of which there is connected an output filter network composed of a series resonant circuit $L_s C_s$ and a parallel resonant circuit $C_p L_p$. The load impedance $Z_{load}$ is connected at the output of the filter. In series with the series resonant circuit there is coupled a circuit branch for generating a suitable voltage for the current feedback, in this illustrated case composed of a current transformer 2 and an amplifier 3. Other circuit variations are also possible in this branch, as for example a series resistance in place of the current transformer in the output current circuit of the power amplifier. In parallel to the parallel resonant circuit is another conversion circuit for generating a voltage for the voltage feedback, in this case consisting of the amplifier 4. The amplifiers 3 and 4 have the amplification factors $v_{J1}$ and $v_{U2}$ that are so set or adjusted that a suitable excitation voltage for the power amplifier will result at a later stage. Because of the high output voltage of the power amplifier 1 the amplification factor of the amplifier in the voltage feedback branch is usually less than unity ($v_{U2} < 1$).

The output voltages of the two amplifiers 3 and 4 are supplied to an electronic switch 5 which makes a selection in accordance with the instantaneous load impedance.

The high frequency power generator is in this example switched on by supplying the operating voltage $U_B$ through the switch 6. It is assumed that the overall high frequency apparatus with such peripheral devices and auxillary voltages as are appropriate has already been switched on. By actuation of the switch 6 the provision of high frequency power is enabled. At this instant the start of oscillation of the high frequency power generator must therefore be initiated. For that purpose the auxiliary oscillator 7 is connected, through the electronic switch 8 and the pulse shaper or preamplifier stage 9, to the input of the power amplifier 1. The auxiliary oscillator 7 in this example is tuned to the midfrequency of operation, i.e. to the design resonant frequencies $f_s$ of the series resonant circuit and $f_p$ of the parallel resonant circuit, which as a rule may be assumed to be equal. The high frequency power generator now oscillates at this frequency. As soon as a voltage derived by one of the amplifiers 3 and 4, from the output current or the output voltage, is distinctly different from zero, the electronic switch 8 switches over to self excitation i.e. to feedback operation. This is performed in the illustrated example by the assistance of the rectifiers 10 and 11 and the electronic OR gate 12.

The expression "distinctly different from zero" should be understood as meaning that the voltage derived by the amplifier 3 or 4 from the output current or the output voltage of the power amplifier 1 must be sufficient for exciting the power amplifier to stay in oscillation. Relatively small values of voltage are sufficient for this purpose, however, because of the high loop amplifications that are possible with the illustrated circuit.

The thresholds of the OR gate 12 are therefore so set that its output signal changes state when the input voltage shows sufficient amplitude for the excitation of the power amplifier 1.

The electronic selector switch 5 is intended to switch the feedback branch to current feedback when the load impedance is below the characteristic. value and to switch to voltage feedback when the load impedance exceeds the characteristic value. For that purpose an additional circuit branch is provided in FIG. 1 consisting of a current transformer 13, an amplifier 14, a rectifier 15 and a comparator 16. A signal proportional to the load current $I_2$ is derived by means of the current converter 13 and that signal is brought to a suitable amplitude level by the amplifier 14 and then is rectified in the rectifier 15. The rectifier output is compared in the comparator 16 with the output signal of the rectifier 11. The amplification factors $v_{U2}$ of the amplifier 4 and $v_{J2}$ of the amplifier 14 are so set that the output signal of the comparator 16 jumps from one state to the other when the load impedance value changes in a change that passes through the characteristic value. In order to avoid continual changing of state of the comparator 16 when the load impedance for a long time is located at or very close to the value of the characteristic impedance, the comparator 16 illustrated in FIG. 1 is provided with hysteresis.

The power amplifier 1 operates in a switching mode in a high frequency power generator according to the invention. Since the amplifying elements of the power amplifier 1 are alternately of extremely high resistance and of extremely low resistance in this type of operation, the output voltage $U_1$ has a negligably small phase shift compared to the control voltage of the power amplifier 1. In this case of current feedback the current $I_1$ controls the feedback. Attention is given to the fact that since the phase shift in the current feedback branch of the illustrated circuit is very small, the result is that extremely small phase shifts are obtained between the output current $I_1$ and the output voltage $U_1$ during operation with current feedback. The frequency automatically sets itself so that this condition is fulfilled. This involves primarily the actual resonant frequency of the series resonant circuit. Changes of the components $L_p$ and $C_p$ as well as mistuning by the reactive components of the load impedance and mistuning of the parallel resonant circuit are thus automatically taken account of.

Current feedback thus produces the smallest possible losses in the amplifier elements of the power amplifier 1 and therefore the highest possible efficiency, the smallest possible harmonics and pulse overshoots and hence the safest operation. The small frequency shifts that occur have no substantial effect on the desired effects of the high frequency power which has been described earlier.

It is nevertheless advantageous to switch to voltage feedback when the load impedance rises above the characteristic impedance $R_c$. This will now be explained with reference to FIG. 2 which shows the locus curves of the input impedance of the output filter network as seen from the power amplifier 1 for four different values of load impedance. For reasons of simplicity, only real values of $R_{load}$ are taken for this figure. The example described is for the case in which $$\sqrt{L_s/C_p} = 1 \text{ kohm.}$$

Since the resonance frequency $f_s$ of the series resonant circuit and $f_p$ of the parallel resonant circuit are nominally equal, the following equation holds.

$$L_s * C_s = L_p * C_p$$

and therefore also $$\sqrt{L_p/C_s} = 1 \text{ kohm.}$$

Figure 2:
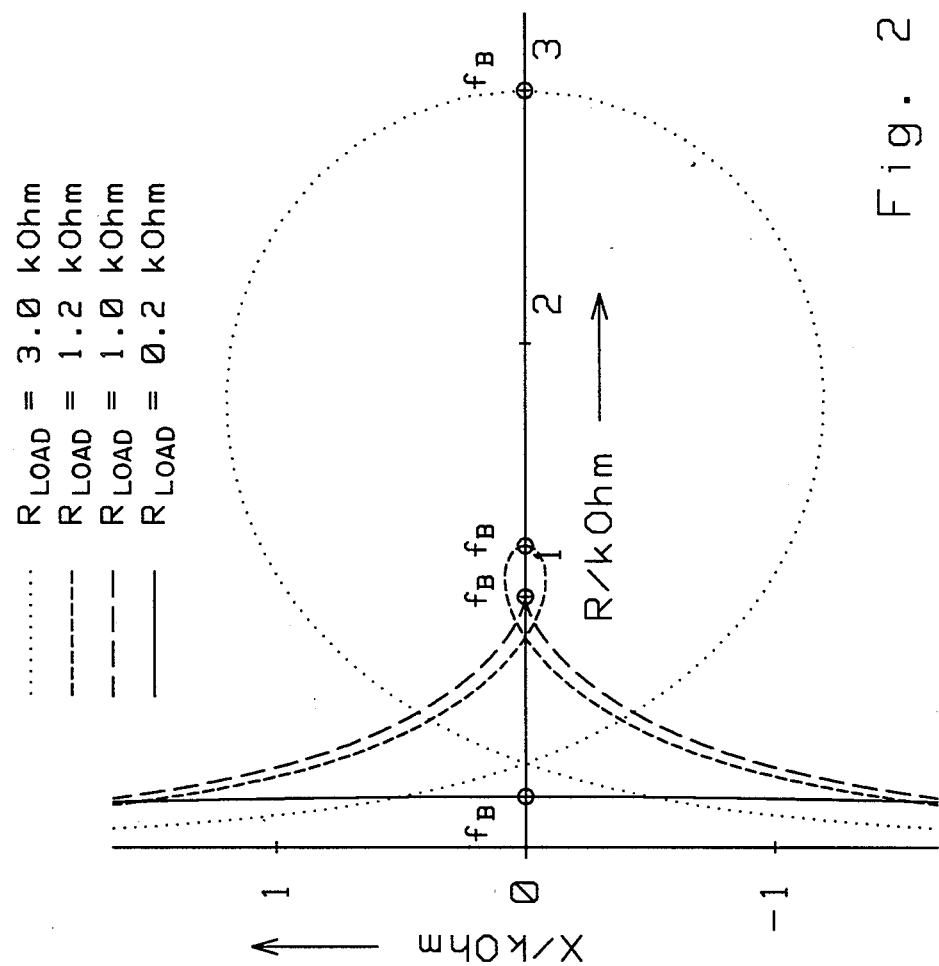
FIG. 2 is a diagram of locus curves of input impedance of the output filter as seen from the power amplifier for different values of load impedance $R_{load}$.

The characteristic impedance $R_c$ would also be 1 k ohm in this example. The four locus curves in FIG. 2 are drawn for the load impedances 0.2 k ohm, 1 k ohm, 1.2 k ohm and 3 k ohm. Each locus curve intersects the real axis of the diagram at the resonance frequency of the series resonant circuit and the parallel resonant circuit. This frequency is in FIG. 1 designated in each case as the desired operating frequency $f_B$. When the load impedance rises above the characteristic impedance, however, the locus curve of the input impedance describes a loop with two additional points of intersection with the real axis.

In the case of current feedback the high frequency power generator would not operate at the desired operation frequency $f_B$, but at one of the two other frequencies providing a real input impedance. At this frequency the reactive currents flow through the amplifier elements of the power amplifier and the available output power and the efficiency rapidly decline. In consequence the loss power in the amplifier elements of the power amplifier rises and the continuity or reliability of operation is threatened. When the load impedance is only slightly above the characteristic impedance this effect is not very prominent, as shown by the locus for $R_{load} = 1.2$ k ohm. For this reason certain tolerances of the switchover threshold are permissible.

In the case of load impedances which are high compared with the characteristic impedance, the switchover of the feedback to voltage feedback according to the invention brings the high frequency generator back to the desired frequency of operation $f_B$. This provides substantial advantages with respect to the loss power, efficiency, the available power output and the reliability and safety of operation.

When a low-impedance power amplifier is used, the provision of voltage feedback is basically problematical. For this reason, in the practice of the invention it is preferred to provide a voltage feedback from the voltage in the parallel resonant circuit, hence from beyond the series resonant circuit. In all practical cases the series resonant circuit then takes over the frequency determining function, i.e. after switching between current and voltage feedback, the high frequency power generator oscillates at practically the same frequency thereafter.

It is also significant that mistuning of the resonance circuits as well as changes of the components by aging are compensated for through the feedback.

Figure 3:
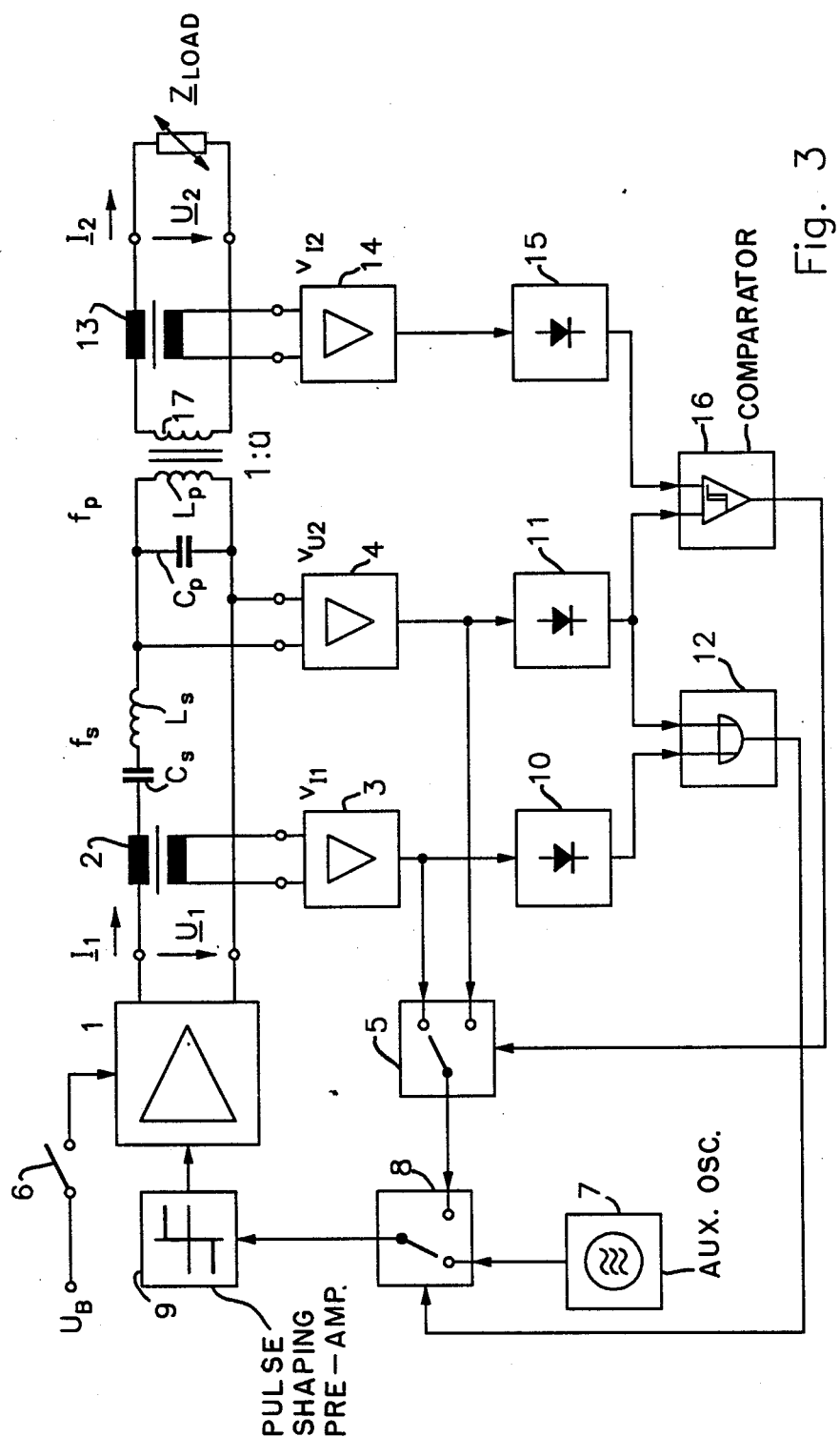
FIG. 3 is a circuit block diagram of a high frequency generator having a single measurement circuit for current measurement for estimating the load impedance.

FIG. 3 shows a high frequency power generator in which the iductance $L_p$ of the parallel resonant circuit is replaced by a transformer with the voltage transformation ratio of 1:n. In this case the resonant circuit capacitance $C_p$ is connected in parallel to the primary side of the transformer. In this case the determination of the characteristic impedance $R_c$ must take into account the impedance transformation ratio $n^2$ of the transformer. The capacitance $C_p$ can also be connected in parallel to the secondary side of the transformer. In that case it must be taken into account that $C_p$ also appears transformed by $1/n^2$ in the primary circuit, for which reason the characteristic impedance $R_c$ is to be calculated by the previously described formula for this case.

Figure 4:
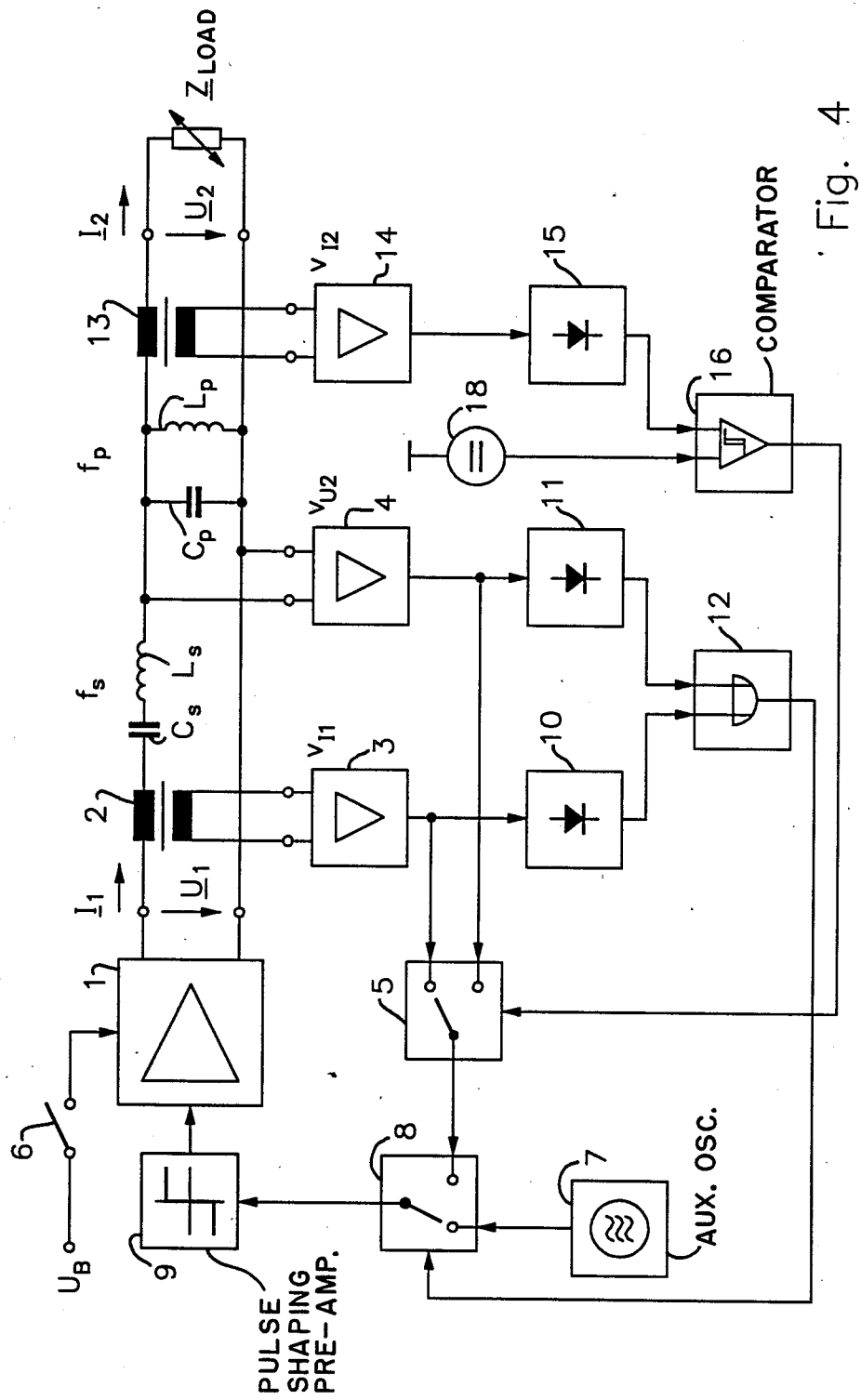
FIG. 4 is a circuit block diagram of a high frequency generator having a parallel resonance inductance $L_p$ constituted as a transformer for matching the load impedance.

FIG. 4 shows an example of a high frequency power generator in which the load impedance only needs to be estimated for determining the criterion for switchover between current and voltage feedback. This circuit is suitable for cases in which the output voltage of the high frequency power generator is not subject to a very large fluctuations. In this case it is sufficient to measure only the load current $I_2$ and to compare that with a reference value. In FIG. 4 this is performed by use of the reference value signal source 18 that is adjusted so that its voltage has approximately the magnitude of the output voltage of the rectifier 15 in a typical operation condition when the load impedance has the value of the characteristic impedance.

Figure 5:
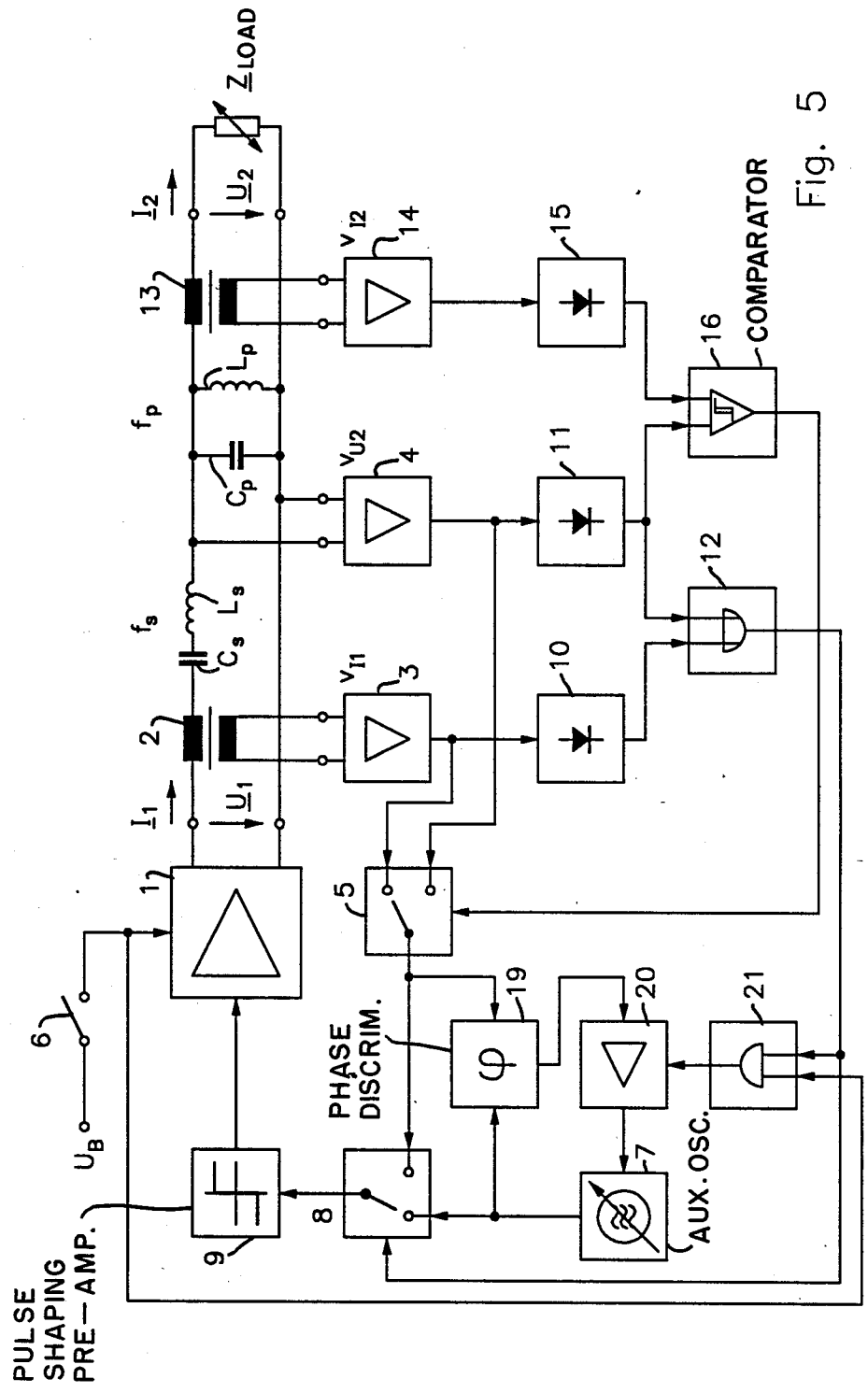
FIG. 5 is a block circuit diagram of a high frequency power generator having an auxiliary oscillator synchronized by a phase locked loop (PLL) circuit.

FIG. 5 shows a high frequency power generator in which the auxiliary oscillator 7 is constructed as a voltage controlled oscillator (VCO). The quiescent frequency of this auxiliary oscillator corresponds to the desired operation frequency. The auxiliary oscillator provides the power amplifier 1 with start up assistance at this frequency in its first activation. The output voltage of the auxiliary oscillator is compared with the oscillation frequency of the high frequency power generator by means of the phase discriminator 19. The result of this phase measurement, which is significant only as long as the high frequency power generator oscillates in the feedback mode, is supplied to the input of a sample-and-hold amplifier 20. As soon as the high frequency power generator had been started, i.e. operates in the feedback mode, the sample-and-hold amplifier 20 is connected through to the auxiliary oscillator 7. For that purpose the output signal of the OR gate 12, which also produces the switchover from external excitation to feedback, being correlated with the activation signal of the switch 6 in the AND gate 21, is supplied to the control input of the sample-and-hold amplifier 20 for transfer of the sampled-and-held signal to the auxiliary oscillator 7.

The enabling of the output of the sample-and-hold amplifier 20 closes the phase lock loop and synchronizes the auxiliary oscillator 7 to the instantaneous self-excitation frequency of the high frequency power generator. As soon as the high frequency power generator is deactivated, however, the sample-and-hold amplifier 20 is switched off by the AND gate 21 and the auxiliary oxcillator 7 oscillates with the last actual frequency of the high frequency power generator. It is at this frequency that the auxiliary power generator 7 assists the high frequency power generator at its next activation. This frequency as a rule represents the most probable value for the frequency at which the high frequency power generator will start up.

Although the invention has been illustrated with reference to particular illustrative examples, it will be understood that further modifications and variations are possible within the inventive concept. It should be noted with respect to the measurement circuits that an electrical magnitude proportional to a current or voltage value include a possiblity of being equal, for example, to the current or voltage value in question, that being the case of a 1:1 proportion.

A suitable quasi-complementary amplifier for use as the power amplifier 1 in FIGS. 1, 3, 4, and 5 is described in the article "DC/AC-Converter with High Efficiency", Elektronik 1983, Vol. 4, pp. 67 (in German language).

We claim:

1. High frequency generator for providing a high-frequency power input to a variable and/or unknown load impedance, comprising a power amplifier operating in a switching mode and having an output and a control input, an output filter network for connecting said amplifier output to a load impedance, said network comprising a series resonant branch tuned to about the midfrequency of operation of the generator and a parallel-resonant branch tuned to about the midfrequency of operation of the generator, said series resonant branch being interposed between said parallel resonant branch and the output of said power amplifier and further comprising:

means for supply of self-excitation of oscillation to said power amplifier constituted by feedback connections between said output filter network and said power amplifier said feedback connections comprising:

a current-driven feedback circuit comprising proportional electrical conversion means (2, 3) coupled to said series resonant network branch ($L_s$, $C_s$) and a pulse shaping stage (9) for providing current-driven feedback whenever the value of said load impedance ($Z_{load}$) falls below a predetermined characteristic impedance value ($R_c$);

a voltage-driven feedback circuit comprising proportional electrical conversion means (4) coupled to said parallel resonant network branch ($L_p$, $C_p$) and a pulse shaping stage (9) for providing voltage-driven feedback whenever the value of said load impedance ($Z_{load}$) rises above said predetermined characteristic impedance ($R_c$), and first electronic switching means including an electronic switch element (5) for selectively switching into activity one or the other of said feedback circuits for assuring the transfer of feedback action between them in response to load impedance fluctuation during utilization of said generator.

2. High frequency generator according to claim 1, wherein said predetermined characteristic value ($R_c$) of said load impedance ($Z_{load}$) responds at least approximately to the equation $$R_c = \sqrt{L_s/C_p}$$

wherein $L_s$ is the inductance of said series resonant network branch and $C_p$ is the capacitance of said parallel resonant network branch.

3. High frequency generator according to claim 1, wherein the inductance ($L_p$) of said parallel resonant network branch is constituted as a transformer (17) for providing a predetermined transformation ratio for matching a load impedance ($Z_{load}$) to said output of said high frequency generator according to known design rules, said capacitance ($C_p$) of said parallel resonant network branch is connected to a winding of said transformer serving as a primary winding and excited by said power amplifier, and said first electronic switching means are constituted for switching to a voltage-driven or current-driven feedback when said load impedance ($Z_{load}$) respectively rises above or falls below $$R_c = n^2 * \sqrt{L_s/C_p},$$

wherein n is the transformation ratio of said transformer (17).

4. High frequency generator according to claim 1, wherein the inductance $L_p$ of said parallel resonant network branch is constituted as a transformer (17) providing transformation for matching said high frequency generator to a load impedance ($Z_{load}$) according to known principles, said capacitance of said parallel resonant network branch being connected in parallel to a secondary winding of said transformer (17) which is excited by a primary winding thereof which is in turn excited by said power amplifier, and said first electronic switching means is constituted for switching to voltage-driven or current driven feedback when said load impedance respectively rises above or falls below the value $$R_c = n^2 * \sqrt{L_s/C_p},$$

wherein n is the transformation ratio of said transformer (13).

5. High frequency generator according to claim 1, wherein said first electronic switching means comprises:
   first measuring means 4, 11 for determining a magnitude proportional to voltage ($U_2$) at an output of said high frequency generator;
   second measuring means (14, 15) for determining a magnitude proportional to the value of output current of said high frequency generator;
   said measuring means having respective proportionality factors $v_{U2}$ and $v_{I2}$ so predetermined that their respective output signals are substantially equal when the load impedance ($Z_{load}$) connected to said high frequency generator has said characteristic value ($R_c$), and
   comparator circuit means (16) connected to said first and second measuring means for comparing said respective magnitudes detemined thereby and providing an output signal for controlling said electronic switch element of said first electronic switching means.

6. High frequency generator according to claim 1, wherein said first electronic switching means comprises:
   measuring means (14, 15) for determining a magnitude proportional to the value of output current ($I_2$) of said high frequency generator, and
   comparator means (16) connected to an output of said measuring means and to a source (18) of an electrical reference signal for comparing said magnitude determined by said measuring means with said reference signal,
   the switch element of said first electronic switching means being responsive to the output of said comparator means, and said reference signal being set at a value for causing said switch element to switch over at approximately said characteristic value ($R_c$) of said load impedance ($Z_{load}$).

7. High frequency generator according to claim 5, wherein said comparator circuit means (16) has a hysteresis output characteristic.

8. High frequency generator according to claim 6, wherein said comparator means (16) has a hysteresis output characteristic.

9. High frequency generator according to claim 1, further comprising an auxiliary oscillator (7) connected for initially exciting oscillation of said power amplifier by supplying an oscillation start voltage of said power amplifier and circuit means for enabling said self-excitation supply means to become dominant compared to said auxiliary oscillator as a source of oscillatory excitation of said amplifier after an oscillation start.

10. High frequency generator according to claim 5, further comprising an auxiliary oscillator (7) connected for initially exciting oscillation of said power amplifier by supplying an oscillation start voltage to said power amplifier and circuit means for enabling said self-excitation supply means to become dominant compared to said auxiliary oscillator as a source of oscillatory excitation of said amplifier after an oscillation start.

11. High frequency generator according to claim 6, further comprising an auxiliary oscillator (7) connected for initially exciting oscillation of said power amplifier by supplying an oscillation start voltage to said power amplifier and circuit means for enabling said self-excitation supply means to become dominant compared to said auxiliary oscillator as a source of oscillatory excitation of said amplifier after an oscillation start.

12. High frequency generator according to claim 9, wherein said power amplifier is provided with an activating switch (6) for switching on said power amplifier and wherein said auxiliary oscillator is constituted, and connected to a control input of said power amplifier, for providing a single pulse to said power amplifier following every switching on of said power amplifier.

13. High frequency generator according to claim 10, wherein said power amplifier is provided with an activating switch (6) for switching on said power amplifier and wherein said auxiliary oscillator is constituted, and connected to a control input of said power amplifier, for providing a single pulse to said power amplifier following every switching on of said power amplifier.

14. High frequency generator according to claim 11, wherein said power amplifier is provided with an activating switch (6) for switching on said power amplifier and wherein said auxiliary oscillator is constituted, and connected to a control input of said power amplifier, for providing a single pulse to said power amplifier following every switching on of said power amplifier.

15. High frequency generator according to claim 9, further including second electronic switching means responsive to values of current or voltage in said output filter network differing substantially from zero and interposed between said first switching means and said control input of said power amplifier, wherein said power amplifier is provided with an activating switch (6) for switching said power amplifier on and off and wherein said auxiliary oscillator (7) is constituted for providing pulses with a repetition period somewhat greater than said midfrequency of operation of said high frequency generator and is connected so as to provide, following every switching on of said power amplifier, a train of pulses to said control input of said power amplifier until said second electronic switching means (8) is switched to enable feedback excitation to said control input of said power amplifier in response to current or voltage in said output filter network.

16. High frequency generator according to claim 10, further including second electronic switching means responsive to values of current or voltage in said output filter network differing substantially from zero and interposed between said first switching means and said control input of said power amplifier, wherein said power amplifier is provided with an activating switch (6) for switching said power amplifier on and off and wherein said auxiliary oscillator (7) is constituted for providing pulses with a repetition period somewhat greater than said midfrequency of operation of said high frequency generator and is connected so as to provide, following every switching on of said power amplifier, a train of pulses to said control input of said power amplifier until said second electronic switching means (8) is switched to enable feedback excitation to said control input of said power amplifier in response to current or voltage in said output filter network.

17. High frequency generator according to claim 11, further including second electronic switching means responsive to values of current or voltage in said output filter network differing substantially from zero and interposed between said first switching means and said control input of said power amplifier, wherein said power amplifier is provided with an activating switch (6) for switching said power amplifier on and off and wherein said auxiliary oscillator (7) is constituted for providing pulses with a repetition period somewhat greater than said midfrequency of operation of said high frequency generator and is connected so as to provide, following every switching on of said power amplifier, a train of pulses to said control input of said power amplifier until said second electronic switching means (8) is switched to enable feedback excitation to said control input of said power amplifier in response to current or voltage in said output filter network.

18. High frequency generator according to claim 9, wherein said auxiliary oscillator provides an output in the form of a continuous alternating voltage of a frequency corresponding to said midfrequency of operation of said generator.

19. High frequency generator according to claim 10, wherein said auxiliary oscillator provides an output in the form of a continuous alternating voltage of a frequency corresponding to said midfrequency of operation of said generator.

20. High frequency generator according to claim 11, wherein said auxiliary oscillator provides an output in the form of a continuous alternating voltage of a frequency corresponding to said midfrequency of operation of said generator.

21. High frequency generator according to claim 9, wherein said auxiliary oscillator (7) is a voltage-controlled oscillator having a quiescent frequency corresponding to said midfrequency of operation of said generator and wherein there is provided a phase regulating loop circuit (19, 20, 21) for causing the auxiliary oscillator (7) to be synchronized with the instantaneous operating frequency of said high frequency generator whenever said high frequency generator oscillates with either voltage or current feedback, and wherein said auxiliary oscillator (7) continues to operate at the last frequency set by said phase regulating circuit during operating pauses of said high frequency generator and supplies oscillations of said last mentioned frequency to said power amplifier on reactivation of said high frequency generator.

22. High frequency generator according to claim 10, wherein said auxiliary oscillator (7) is a voltage-controlled oscillator having a quiescent frequency corresponding to said midfrequency of operation of said generator and wherein there is provided a phase regulating loop circuit (19, 20, 21) for causing the auxiliary oscillator (7) to be synchronized with the instantaneous operating frequency of said high frequency generator whenever said high frequency generator oscillates with either voltage or current feedback, and wherein said auxiliary oscillator (7) continues to operate at the last frequency set by said phase regulating circuit during operating pauses of said high frequency generator and supplies oscillations of said last mentioned frequency to said power amplifier on reactivation of said high frequency generator.

23. High frequency generator according to claim 11, wherein said auxiliary oscillator (7) is a voltage-controlled oscillator having a quiescent frequency corresponding to said midfrequency of operation of said generator and wherein there is provided a phase regulating loop circuit (19, 20, 21) for causing the auxiliaty oscillator (7) to be synchronized with the instantaneous operating frequency of said high frequency generator whenever said high frequency generator oscillates with either voltage or current feedback, and wherein said auxiliary oscillator (7) continues to operate at the last frequency set by said phase regulating circuit during operating pauses of said high frequency generator and supplies oscillations of said last mentioned frequency to said power amplifier on reactivation of said high frequency generator.

* * * * *